(12) United States Patent
Spindler et al.

(10) Patent No.: US 8,283,054 B2
(45) Date of Patent: Oct. 9, 2012

(54) TANDEM WHITE OLED WITH EFFICIENT ELECTRON TRANSFER

(75) Inventors: Jeffrey P. Spindler, Rochester, NY (US); Tukaram K. Hatwar, Penfield, NY (US); William J. Begley, Webster, NY (US)

(73) Assignee: Global OLED Technology LLC, Herndon, VA (US)

( * ) Notice: Subject to any disclaimer, the term of this patent is extended or adjusted under 35 U.S.C. 154(b) by 651 days.

(21) Appl. No.: 12/417,883

(22) Filed: Apr. 3, 2009

(65) Prior Publication Data

US 2010/0253209 A1    Oct. 7, 2010

(51) Int. Cl.
*H01L 51/54* (2006.01)

(52) U.S. Cl. ......... 428/690; 428/917; 313/504; 313/506

(58) Field of Classification Search .................. 428/690, 428/917; 313/504, 506
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang | |
| 5,683,823 A | 11/1997 | Shi | |
| 6,107,734 A | 8/2000 | Tanaka | |
| 6,337,492 B1 | 1/2002 | Jones | |
| 6,717,358 B1 | 4/2004 | Liao et al. | |
| 7,906,225 B2 * | 3/2011 | Doetz et al. ................. | 428/690 |
| 2002/0127427 A1* | 9/2002 | Young et al. ................. | 428/690 |
| 2003/0170491 A1 | 9/2003 | Liao et al. | |
| 2003/0189401 A1 | 10/2003 | Kido et al. | |
| 2007/0069198 A1* | 3/2007 | Dotz et al. ...................... | 257/40 |
| 2007/0104977 A1* | 5/2007 | Arakane et al. ................ | 428/690 |
| 2009/0108734 A1* | 4/2009 | Begley et al. ................. | 313/504 |
| 2009/0108735 A1* | 4/2009 | Begley et al. ................. | 313/504 |
| 2009/0108736 A1* | 4/2009 | Begley et al. ................. | 313/504 |
| 2009/0110956 A1* | 4/2009 | Begley et al. ................. | 428/690 |
| 2009/0110957 A1* | 4/2009 | Begley et al. ................. | 428/690 |
| 2009/0162612 A1* | 6/2009 | Hatwar et al. ................ | 428/156 |
| 2009/0242877 A1* | 10/2009 | Kondakov ........................ | 257/40 |
| 2010/0117519 A1* | 5/2010 | Begley et al. ................. | 313/504 |
| 2010/0117520 A1* | 5/2010 | Begley et al. ................. | 313/504 |
| 2010/0141122 A1* | 6/2010 | Begley et al. ................. | 313/504 |
| 2010/0244677 A1* | 9/2010 | Begley et al. ................. | 313/506 |

(Continued)

FOREIGN PATENT DOCUMENTS

JP    07-142169    6/1995

(Continued)

OTHER PUBLICATIONS

Deshpande et al, White-light-emitting organic electroluminescent devices based on interlayer sequential energy transfer, Appl. Phys. Lett. 75, 888 (1999).

(Continued)

*Primary Examiner* — Dawn L. Garrett
(74) *Attorney, Agent, or Firm* — Morgan, Lewis & Bockius LLP

(57) ABSTRACT

A white-light-emitting tandem OLED device having spaced anode and cathode including: first and second light-emitting units disposed between the anode and cathode; an intermediate connector including an n-type layer and a p-type layer disposed between the first and second light-emitting units; and a fluoranthene-containing electron-transporting layer adjacent to the n-type layer of the intermediate connector and including at least 25% of a 7,10-diaryl-substituted fluoranthene compound having no aromatic rings annulated to the fluoranthene nucleus.

14 Claims, 2 Drawing Sheets

U.S. PATENT DOCUMENTS

2010/0288362 A1* 11/2010 Hatwar et al. ............... 136/263

FOREIGN PATENT DOCUMENTS

| | | | |
|---|---|---|---|
| JP | 2003-045676 | | 2/2003 |
| WO | WO 2005/033051 | * | 4/2005 |

OTHER PUBLICATIONS

Kido et al, White light-emitting organic electroluminescent devices using the poly(N-vinylcarbazole) emitter layer doped with three fluorescent dyes, Appl. Phys. Lett. 64, 815 (1994).

Deshpande et al, White-light-emitting organic electroluminescent devices based on interlayer sequential energy transfer, Appl. Phys. Lett. 75, 888 (1994).

Tokito et al, High-efficiency white phospherescent organic light-emitting devices with greenish-blue and red-emitting layers, Appl. Phys. Lett. 83, 2450 (2003).

Matsumoto et al, Multiphoton organic EL device having Charge Generation Layer, SID 03 Digest, 979 (2003).

* cited by examiner

TANDEM WHITE OLED WITH EFFICIENT ELECTRON TRANSFER

CROSS REFERENCE TO RELATED APPLICATION

Reference is made to commonly assigned U.S. patent application Ser. No. 11/924,631 filed Oct. 26, 2007, entitled "OLED Device With Electron Transport Materials" by Begley, the disclosure of which is incorporated herein by reference.

FIELD OF THE INVENTION

The present invention relates to broadband light-producing OLED displays suitable for large displays.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit includes at least a hole-transporting layer (HTL), a light-emitting layer (LEL), and an electron-transporting layer (ETL). OLEDs are attractive because of their low drive voltage, high luminance, wide viewing-angle, and capability for full color displays and for other applications. Tang et al. described this multilayer OLED in their U.S. Pat. Nos. 4,769,292 and 4,885,211.

OLEDs can emit different colors, such as red, green, blue, or white, depending on the emitting property of its LEL. Recently, there is an increasing demand for broadband OLEDs to be incorporated into various applications, such as a solid-state lighting source, color display, or a fill color display. By broadband emission, it is meant that an OLED emits sufficiently broad light throughout the visible spectrum so that such light can be used in conjunction with filters or color change modules to produce displays with at least two different colors or a full color display. In particular, there is a need for broadband-light-emitting OLEDs (or broadband OLEDs) where there is substantial emission in the red, green, and blue portions of the spectrum, i.e., a white-light-emitting OLED (white OLED). The use of white OLEDs with color filters provides a simpler manufacturing process than an OLED having separately patterned red, green, and blue emitters. This can result in higher throughput, increased yield, and cost savings. White OLEDs have been reported, e.g. by Kido et al. in *Applied Physics Letters*, 64, 815 (1994), J. Shi et al. in U.S. Pat. No. 5,683,823, Sato et al. in JP 07-142169, Deshpande et al. in *Applied Physics Letters*, 75, 888 (1999), and Tokito, et al. in *Applied Physics Letters*, 83, 2459 (2003).

In order to achieve broadband emission from an OLED, more than one type of molecule has to be excited, because each type of molecule only emits light with a relatively narrow spectrum under normal conditions. A light-emitting layer having a host material and one or more luminescent dopant(s) can achieve light emission from both the host and the dopant(s) resulting in a broadband emission in the visible spectrum if the energy transfer from the host material to the dopant(s) is incomplete. To achieve a white OLED having a single light-emitting layer, the concentrations of light-emitting dopants must be carefully controlled. This produces manufacturing difficulties. A white OLED having two or more light-emitting layers can have better color and better luminance efficiency than a device with one light-emitting layer, and the variability tolerance for dopant concentration is higher. It has also been found that white OLEDs having two light-emitting layers are typically more stable than OLEDs having a single light-emitting layer. However, it is difficult to achieve light emission with strong intensity in the red, green, and blue portions of the spectrum. A white OLED with two light-emitting layers typically has two intensive emission peaks.

A tandem OLED structure (sometimes called a stacked OLED or a cascaded OLED) has been disclosed by Jones et al. in U.S. Pat. No. 6,337,492, Tanaka et al. in U.S. Pat. No. 6,107,734, Kido et al. in JP Patent Publication 2003/045676A and U.S. Patent Application Publication No. 2003/0189401 A1, and Liao et al. in U.S. Pat. No. 6,717,358 and U.S. Patent Application Publication No. 2003/0170491 A1. This tandem OLED is fabricated by stacking several individual OLED units vertically and driving the stack using a single power source. The advantage is that luminance efficiency, lifetime, or both are increased. However, the tandem structure increases the driving voltage approximately in proportion to the number of OLED units stacked together.

Matsumoto and Kido et al. reported in *SID 03 Digest*, 979 (2003) that a tandem white OLED is constructed by connecting a greenish blue EL unit and an orange EL unit in the device, and white light emission is achieved by driving this device with a single power source. Although luminance efficiency is increased, this tandem white OLED device has weaker green and red color components in the spectrum. In U.S. Patent Application Publication No. 2003/0170491 A1, Liao et al. describe a tandem white OLED structure by connecting a red EL unit, a green EL unit, and a blue EL unit in series within the device. When the tandem white OLED is driven by a single power source, white light emission is formed by spectral combination from the red, green, and blue EL units.

Notwithstanding these developments, there remains a need to improve driving voltage of OLED devices while maintaining efficiency and good broadband emission.

SUMMARY OF THE INVENTION

There is a need to improve driving voltage of OLED devices while maintaining efficiency and good broadband emission.

This object is achieved by a white-light-emitting tandem OLED device having spaced anode and cathode comprising:

(a) first and second light-emitting units disposed between the anode and cathode;

(b) an intermediate connector comprising an n-type layer and a p-type layer disposed between the first and second light-emitting units; and (c) a fluoranthene-containing electron-transporting layer adjacent to the n-type layer of the intermediate connector and comprising at least 25% of a 7,10-diaryl-substituted fluoranthene compound having no aromatic rings annulated to the fluoranthene nucleus.

It is an advantage of this invention that it can provide a display with increased efficiency while maintaining good color emission and a low voltage requirement.

Figure 1:
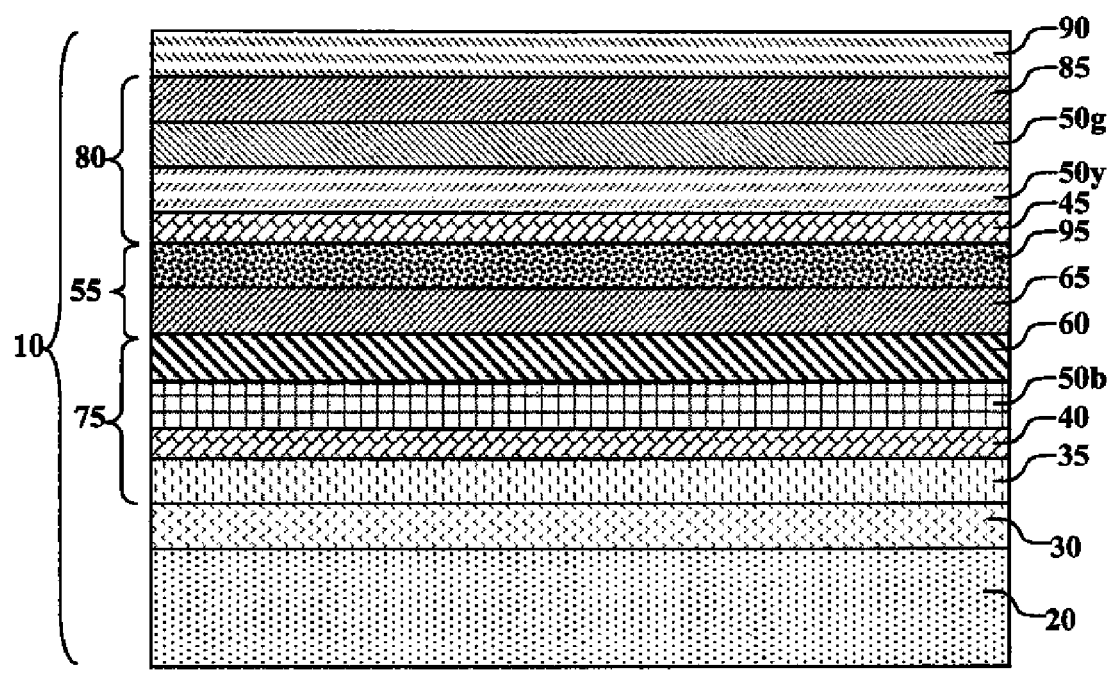
FIG. 1 shows a cross-sectional view of one embodiment of a tandem OLED device in accordance with this invention.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" is used in its art-recognized meaning of a display device including organic light-emitting diodes as pixels. It can mean a device having a single pixel. The terms "tandem OLED device" and "stacked OLED device" mean an OLED device including two or more light-emitting units arranged vertically, wherein each light-emitting unit is capable of light-emission independently of the others. Each light-emitting unit includes at least a hole-transporting layer, a light-emitting layer, and an electron-transporting layer. The light-emitting units are separated by intermediate connectors. The term "OLED display" as used herein means an OLED device including a plurality of pixels, which can be of different colors. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. The term "hue" refers to the intensity profile of light emission within the visible spectrum, with different hues exhibiting visually discernible differences in color. The term "pixel" is employed in its art-recognized usage to designate an area of a display panel that is stimulated to emit light independently of other areas. It is recognized that in full color systems, several pixels of different colors will be used together to produce a wide range of colors, and a viewer can term such a group a single pixel. For the purposes of this discussion, such a group will be considered several different colored pixels.

In accordance with this disclosure, broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a practical fill color display. For low power consumption, it is often advantageous for the chromaticity of the white-light-emitting OLED to be close to CIE Standard Illuminant $D_{65}$, i.e. 1931 CIE chromaticity coordinates of CIEx=0.31 and CIEy=0.33. This is particularly the case for so-called RGBW displays having red, green, blue, and white pixels. Although CIEx, CIEy coordinates of about 0.31, 0.33 are ideal in some circumstances, the actual coordinates can vary significantly and still be very useful. The term "white-light-emitting" as used herein refers to a device that produces white light internally, even though part of such light can be removed by color filters before viewing.

Turning now to FIG. 1, there is shown a cross-sectional view of a pixel of a white-light-emitting tandem OLED device 10 according to one embodiment of the present invention. OLED device 10 includes a substrate 20, two spaced electrodes, which are anode 30 and cathode 90, first and second light-emitting units 80 and 75, respectively, disposed between the cathode 90 and anode 30, and an intermediate connector 55 disposed between first and second light-emitting units 80 and 75. The intermediate connector 55 includes n-type layer 65 and p-type layer 95. Hatwar et al. in U.S. Pat. No. 7,332,860 has described the use of multiple light-emitting units in a so-called tandem arrangement of this type. In this embodiment, first light-emitting unit 80 emits light that has multiple peaks at wavelengths longer than 500 nm, e.g. in the green, yellow, and red regions of the visible spectrum. First light emitting unit 80 produces substantially no blue emission, meaning that the emission intensity at wavelengths shorter than 480 nm is less than 10% of the maximum emission intensity, and no more than 50% at 490 nm. In this embodiment, first light-emitting unit 80 includes a first light-emitting layer, e.g. green light-emitting layer 50g that includes a green light-emitting compound and produces green emission. First light-emitting unit 80 further includes a second light-emitting layer, e.g. yellow light-emitting layer 50y that includes a yellow light-emitting compound and produces emission in the yellow to red portion of the visible spectrum. As used herein, the term "yellow light-emitting compound" refers to a substance that has its primary light emission in the yellow to red region, that is, from about 570 nm to 700 nm. Second light-emitting unit 75 emits light substantially at wavelengths shorter than 500 nm, that is, in the blue region of the visible spectrum. Second light-emitting unit 75 can have emission at other wavelengths as well. In this embodiment, second light-emitting unit 75 includes a blue light-emitting layer, e.g. blue light-emitting layer 50b, that includes a blue light-emitting compound. Other embodiments of tandem OLED devices as known in the art can also be used in this invention. OLED device 10 also includes electron-transporting layer 85, hole-transporting layers 40 and 45, and a hole-injecting layer 35.

Tandem OLED device 10 further includes an intermediate connector disposed between the light-emitting units, e.g. intermediate connector 55, which includes n-type layer 65 and p-type layer 95. The intermediate connector 55 provides effective carrier injection into the adjacent EL units. Metals, metal compounds, or other inorganic compounds can be effective for p-type layer 95. However, such materials often have low resistivity, which can result in pixel crosstalk. Also, the optical transparency of the layers constituting the intermediate connector should be as high as possible to permit for radiation produced in the EL units to exit the device. Therefore, it is often preferred to use mainly organic materials in the intermediate connector. Examples of p-type layers and materials used in their construction have been described in detail by Hatwar et al. in U.S. Patent Application Publication No. 2007/0001587, the disclosure of which is incorporated by reference. Some further nonlimiting examples of p-type layers are described in U.S. Pat. Nos. 6,717,358 and 6,872,472, and U.S. Patent Application Publication No. 2004/0227460 A1. Many materials for electron-transporting layers, which are described below, are also suitable for p-type layers.

n-type layer 65 can contain one or more metal chelated oxinoid compounds, including chelates of oxine itself, also commonly referred to as 8-quinolinol or 8-hydroxyquinoline. Other n-type materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful n-type materials. It is useful for this invention that n-type layer 65 is a lithium-doped layer.-

OLED device 10 further includes a fluoranthene-containing electron-transporting layer 60 adjacent to n-type layer 65 of intermediate connector 55 and including at least 25% of a 7,10-diaryl-substituted fluoranthene compound having no aromatic rings annulated to the fluoranthene nucleus. Such compounds have been described by Begley in above cited U.S. patent application Ser. No. 11/921,631, the disclosure of which is incorporated by reference. The fluoranthene nucleus contains no heteroatoms as part of the ring system and only 4 annulated rings whose numbering sequence is shown below:

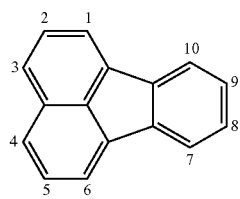

The fluoranthenes useful in this invention contain no additional annulated rings to either the phenyl or naptyl rings of the fluoranthene nucleus. Fluoranthenes with additional ring systems annulated to the nucleus are not useful in this invention. Annulated rings are those rings that share a common ring bond between any two carbon atoms of the fluoranthene nucleus.

Suitably, the 7,10-diaryl-fluoranthene compounds useful in this invention are according to Formula (I):

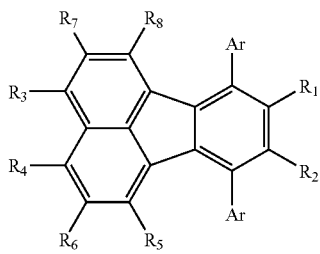

Formula (I)

wherein:
  Ar represents the aromatic rings containing 6 to 24 carbon atoms bonded to the fluoranthene nucleus and can be the same or different; and
  $R_1$-$R_8$ are individually selected from hydrogen and aromatic ring groups containing 6 to 24 carbon atoms with the proviso that no two adjacent $R_1$-$R_8$ substituents can join to form an aromatic ring system annulated to the fluoranthene nucleus.

In formula (I), the Ar group(s) can be heterocyclic but preferred are carbocyclic groups. The Ar group(s) cannot be fused with the fluoranthene nucleus and are connected only by one single bond. Preferred Ar groups are phenyl or napthyl with phenyl being particularly preferred. Compounds where the Ar groups are the same are also desirable.

More preferred compounds useful in this invention are according to Formula (II):

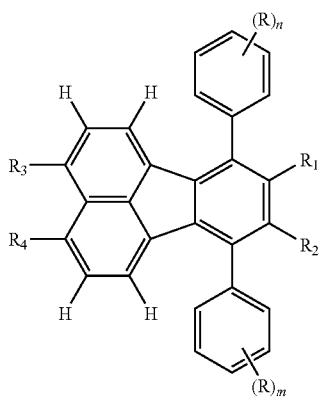

Formula (II)

wherein
  $R_1$, $R_2$, $R_3$ and $R_4$ are independently hydrogen or an aromatic group containing 6 to 24 carbon atoms with the proviso that any adjacent $R_1$-$R_4$ is not joined to form part of an annulated aromatic ring system;
  R is hydrogen or an optional substituent; and
  n and m are independently 1-5.

Most preferred fluoranthenes useful in this invention are according to Formula (III-a) or (III-b):

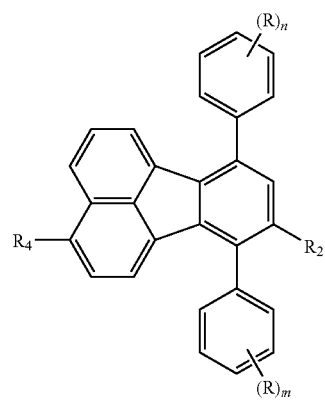

Formula (III-a)

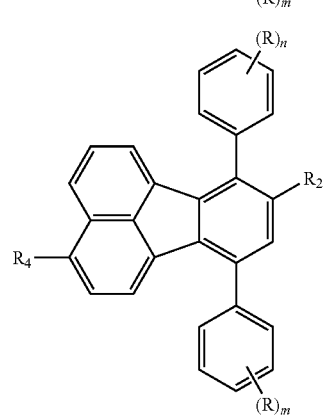

Formula (III-b)

wherein:
  $R_2$ and $R_4$ are independently hydrogen or an aromatic group containing 6 to 24 carbon atoms with the proviso that $R_2$ and $R_4$ cannot both be hydrogen nor can $R_2$ be joined with R to form a ring; and R is hydrogen or an optional substituent; and n and m are independently 1-5.

In Formulas (II) and (III), the most preferred $R_1$, $R_2$, $R_3$ and $R_4$ groups are phenyl or napthyl, which can be further substituted. A particularly preferred substituted phenyl group is biphenyl. Biphenyl can be ortho(o), meta(m) or para(p) substituted biphenyl, with p-biphenyl being particularly preferred. Other aromatic ring systems such as anthracene, phenanthrene, phenanthroline and perylene are also suitable as these substituents. Typically, the R substituent(s) are hydrogen but can be any suitable group chosen to modify the molecular properties. It is also contemplated that the fluoranthene useful in this invention can include more than one separate fluoranthene nucleus; that is, two or more fluoranthene groups can be linked through a single bond so that they are not annulated together.

However, the fluoranthene derivatives used in the invention do not include multiple fluoranthene groups covalently attached to a polymeric backbone or compounds where the fluoranthene nucleus is directly part of a polymeric chain. The fluoranthenes useful in this invention are small molecules with molecular weights typically below 1500, preferably below 1000.

In addition, the fluoranthene compounds used in the invention cannot have any amino substituents attached directly to the fluoranthene nucleus. Thus, none of $R_1$-$R_8$ in Formula (I), (II) or (III) can be an amino group such as diarylamine. However, it is possible that the aromatic rings containing 6 to 24 carbon atoms of $R_1$-$R_8$ can be further substituted with amino groups. However, it is preferred that the fluoranthene compounds useful in this invention are entirely hydrocarbons; that is, contain no heteroatoms either as substituent or contained within a substituent.

Specific examples of fluoranthene light-emitting materials useful in this invention are as follows:

ETM1

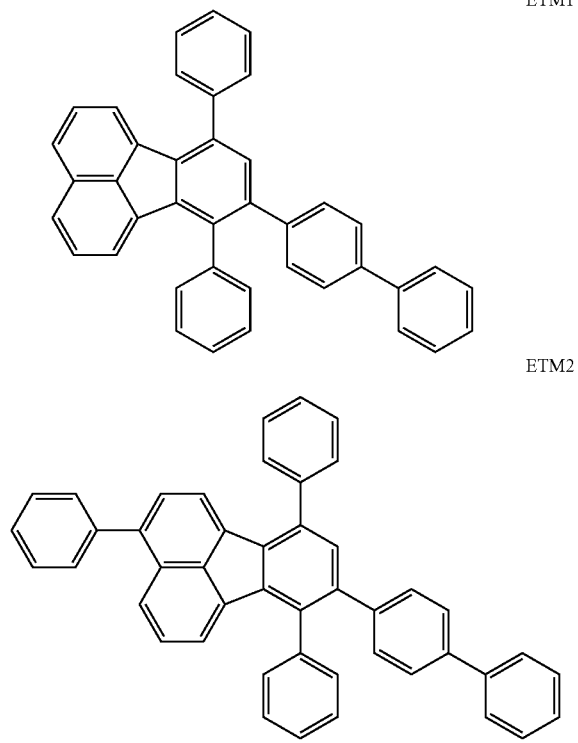

ETM2

ETM3

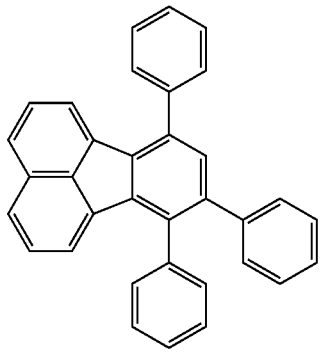

ETM4

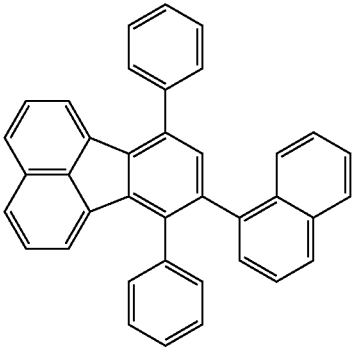

ETM5

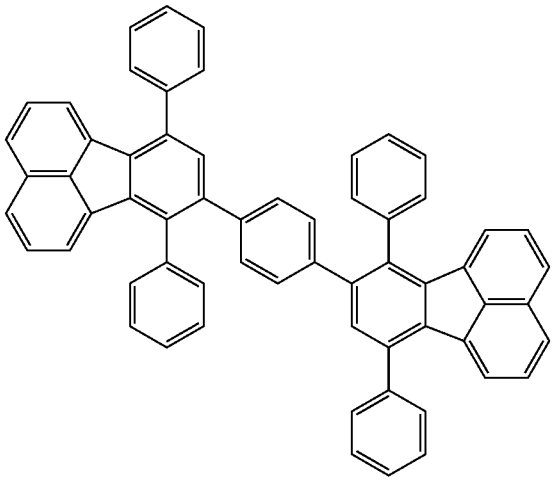

ETM6

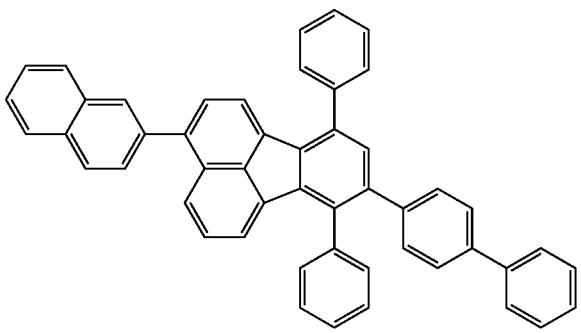

ETM7
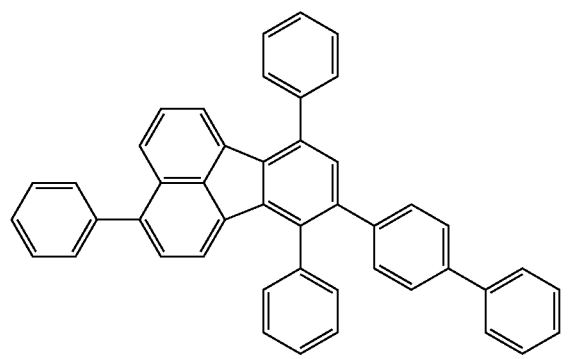
ETM8
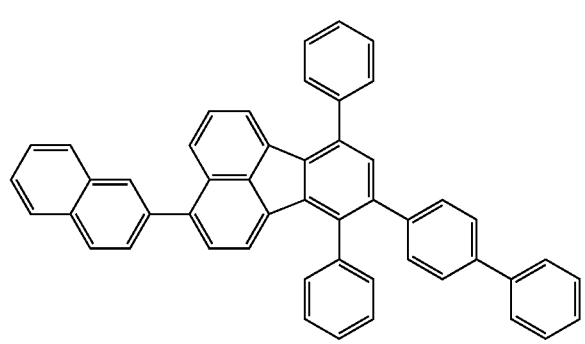
ETM9
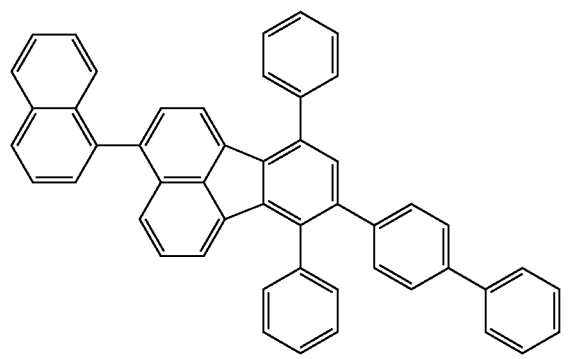
ETM10
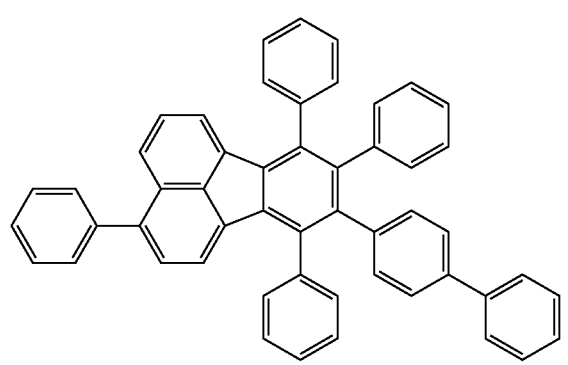
ETM11
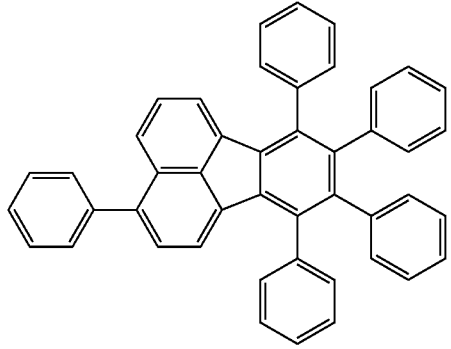
ETM12
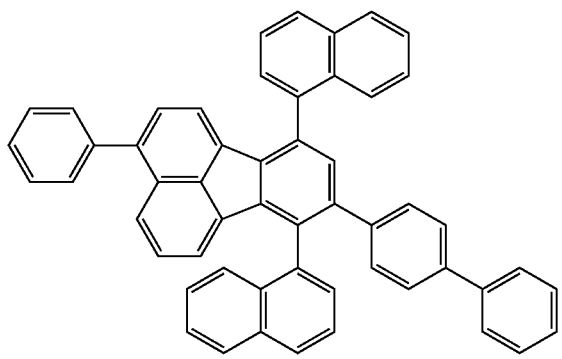
ETM13
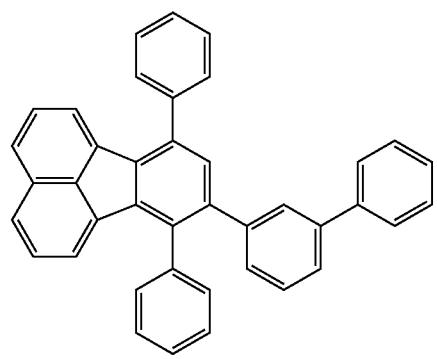
ETM14
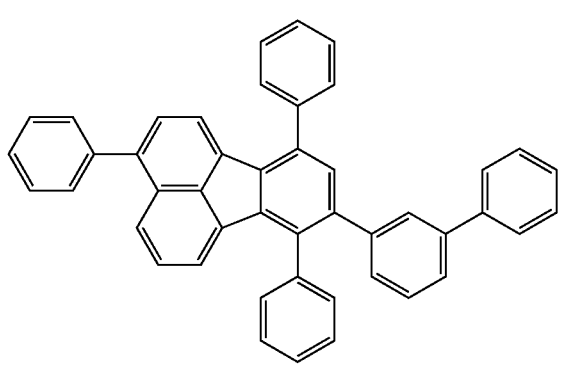

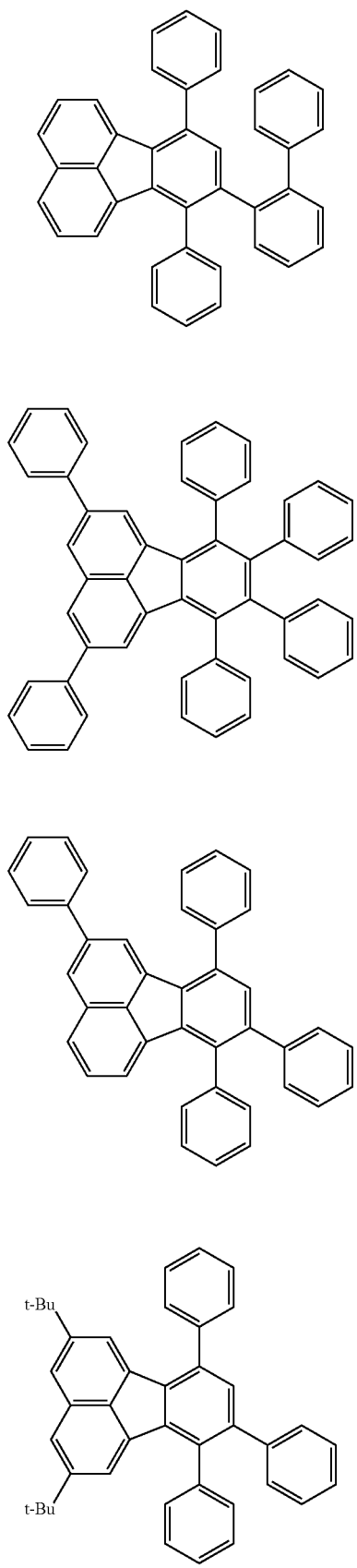
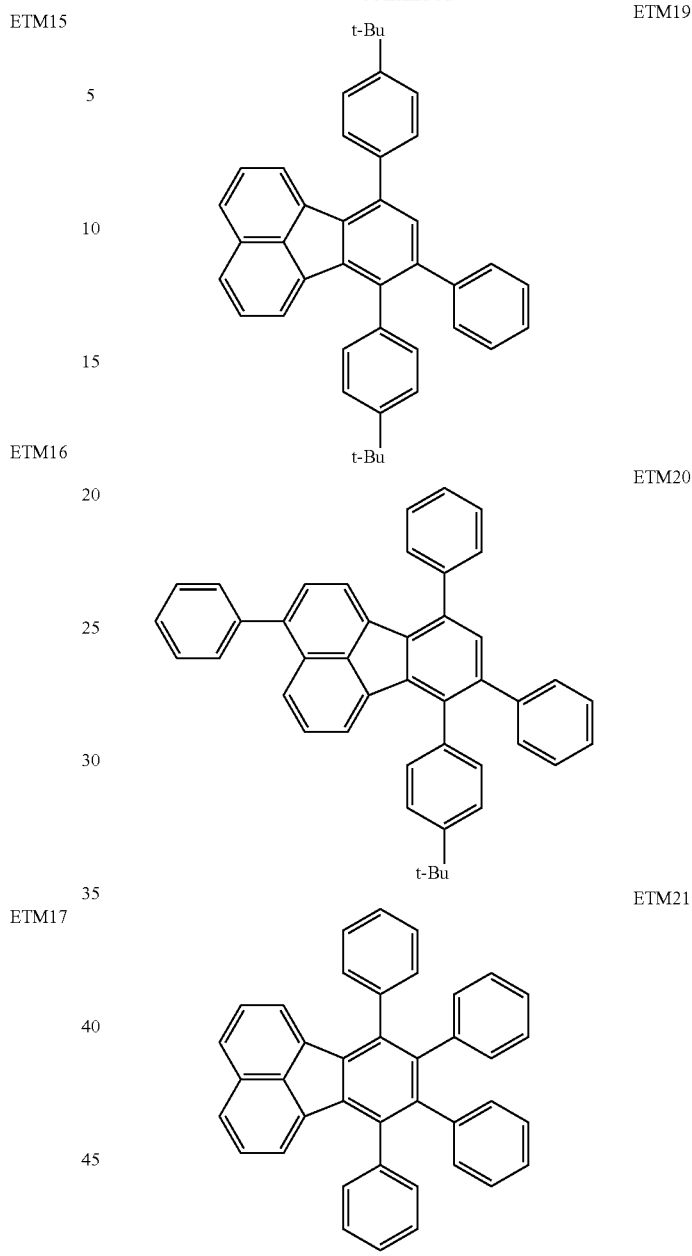

Figure 2:
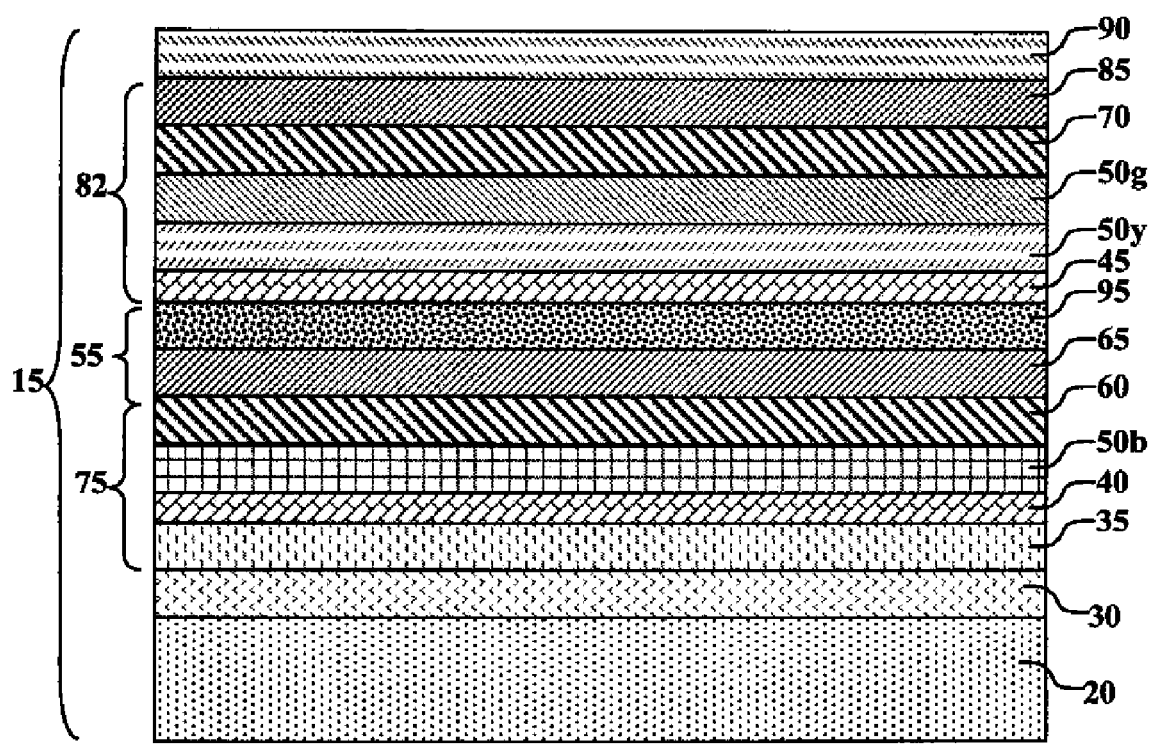
FIG. 2 shows a cross-sectional view of another embodiment of a tandem OLED device in accordance with this invention.

Turning now to FIG. 2, there is shown a cross-sectional view of a pixel of a white-light-emitting tandem OLED device 15 according to another embodiment of the present invention. OLED device 15 includes the elements that are included in OLED device 10, above. Tandem OLED device 15 further includes a second fluoranthene-containing electron-transporting layer 70 adjacent to electron-transporting layer 85, which is adjacent to cathode 90, e.g. light-emitting unit 82. Fluoranthene-containing electron-transporting layer 70 can include the same materials as fluoranthene-containing electron-transporting layer 60, above.

Light-emitting layers such as those described herein produce light in response to hole-electron recombination. Desired organic light-emitting materials can be deposited by any suitable process such as evaporation, sputtering, chemical vapor deposition, electrochemical deposition, or radiation thermal transfer from a donor material. Useful organic light-emitting materials are well known. As more fully described in U.S. Pat. Nos. 4,769,292 and 5,935,721, the light-emitting layers of the OLED device include a luminescent or fluorescent material where electroluminescence is produced as a result of electron-hole pair recombination in this region. The light-emitting layers can include a single material, but more commonly include a host material doped with a guest compound or dopant where light emission comes primarily from the dopant. The dopant is selected to produce color light having a particular spectrum. The host materials in the light-emitting layers can be an electron-transporting material, a hole-transporting material, or another material that supports hole-electron recombination. The dopant is often chosen from highly fluorescent dyes that are generally singlet light-emitting compounds, that is, they emit light from an excited singlet state. However, phosphorescent compounds that are generally triplet light-emitting compounds, that is, they emit light from an excited triplet state, e.g., transition metal complexes as described in WO 98/55561, WO 00/18851, WO 00/57676, and WO 00/70655, are also useful. Dopants are typically coated as 0.01 to 10% by weight into the host material. Host and emitting molecules known to be of use include, but are not limited to, those disclosed in U.S. Pat. Nos. 4,769,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078. Blue light-emitting layer 50b includes a host material and a blue-light-emitting dopant. The blue-light-emitting dopant can be a singlet or a triplet light-emitting compound. The light-emitting layers of first light-emitting units 80 and 82, e.g. light-emitting layers 50g and 50y, can include as dopants singlet light-emitting compounds or triplet light-emitting compounds.

Metal complexes of 8-hydroxyquinoline and similar derivatives (formula A) constitute one class of useful electron-transporting host materials capable of supporting electroluminescence, and are particularly suitable for light emission of wavelengths longer than 500 nm, e.g., green, yellow, orange, and red.

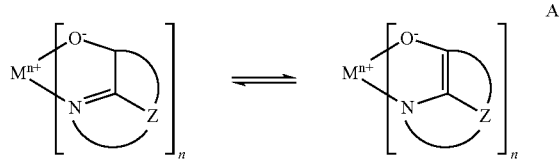

A wherein:
M represents a monovalent, divalent, or trivalent metal;
n is an integer of from 1 to 3; and
Z independently in each occurrence represents the atoms completing a nucleus having at least two fused aromatic rings.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

The host material in one or more of the light-emitting layers of the present invention can include an anthracene derivative having hydrocarbon or substituted hydrocarbon substituents at the 9 and 10 positions. For example, certain derivatives of 9,10-diarylanthracenes (Formula B) are known to constitute a class of useful host materials capable of supporting electroluminescence, and are particularly suitable for light emission of wavelengths longer than 400 nm, e.g., blue, green, yellow, orange or red

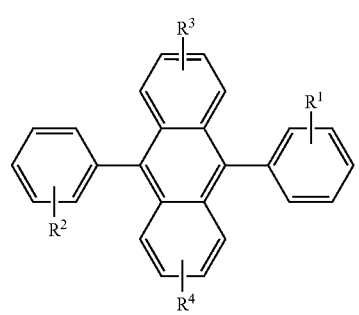

B wherein $R^1$, $R^2$, $R^3$, and $R^4$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Particularly useful are compounds wherein $R^1$ and $R^2$ represent additional aromatic rings. Specific examples of useful anthracene materials for use as a host in a light-emitting layer include:

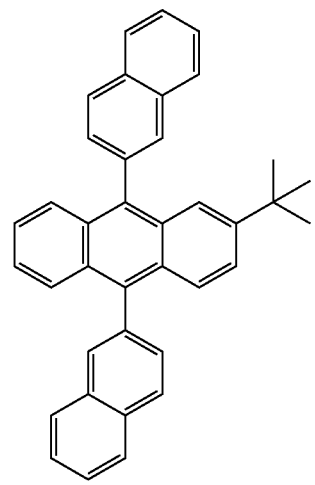

B1

B2
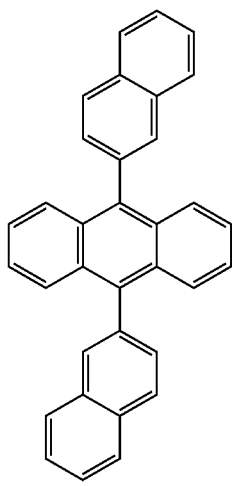
B3
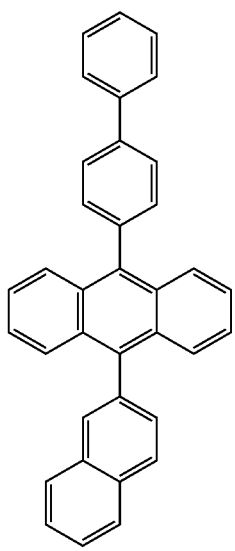
B4
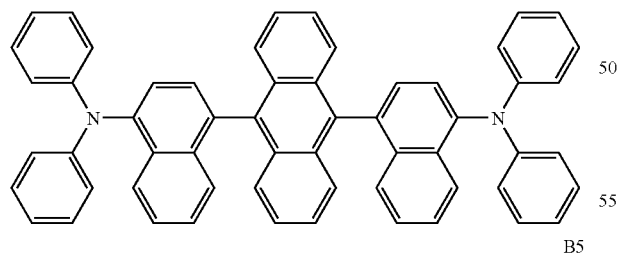
B5
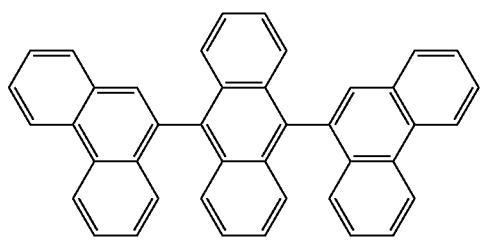
B6
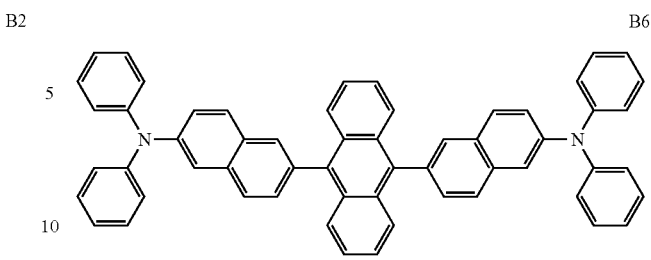
B7
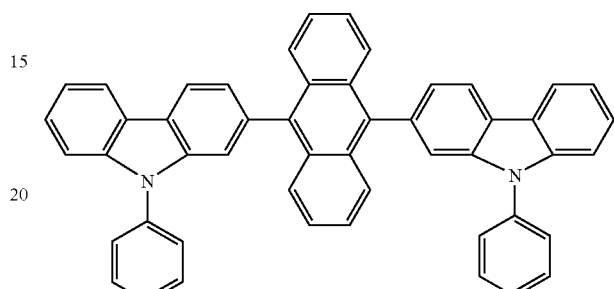
B8
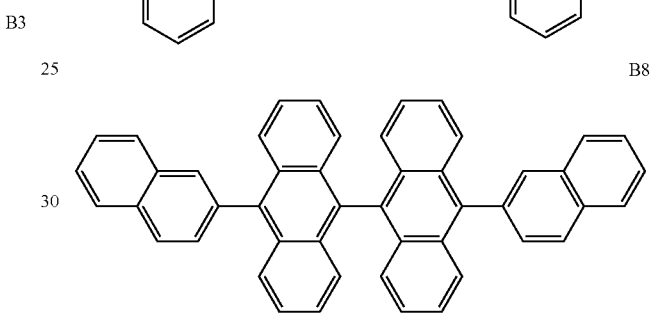
B9
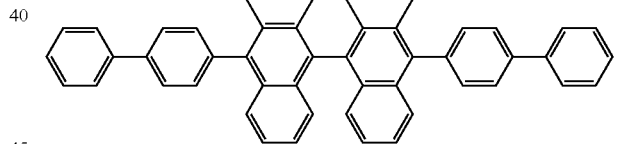
B10
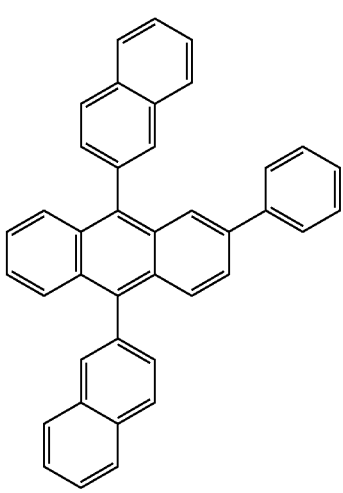

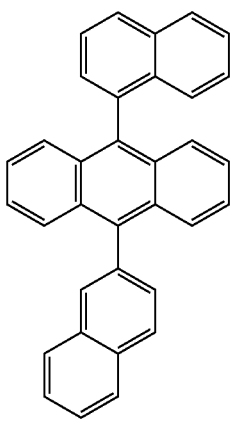

Hole-transporting materials useful as hosts in light-emitting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals or including at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula C.

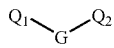

wherein:
 Q$_1$ and Q$_2$ are independently selected aromatic tertiary amine moieties; and
 C is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula C and containing two triarylamine moieties is represented by structural Formula D.

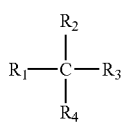

where:
 R$_1$ and R$_2$ each independently represent a hydrogen atom, an aryl group, or an alkyl group or R$_1$ and R$_2$ together represent the atoms completing a cycloalkyl group; and
 R$_3$ and R$_4$ each independently represent an aryl group, which is in turn substituted with a diaryl substituted amino group, as indicated by structural Formula E.

wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines are the tetraaryldiamines. Desirable tetraayldiamines include two diarylamino groups, such as indicated by Formula E, linked through an arylene group. Useful tetraaryldiamines include those represented by Formula F.

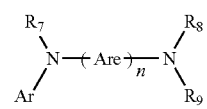

wherein:
 each Are is an independently selected arylene group, such as a phenylene or anthracene moiety;
 n is an integer of from 1 to 4; and
 Ar, R$_7$, R$_8$, and R$_9$ are independently selected aryl groups.
 In a typical embodiment, at least one of Ar, R$_7$, R$_8$, and R$_9$ is a polycyclic fused ring structure, e.g., a naphthalene.

The various alkyl, alkylene, aryl, and arylene moieties of the foregoing structural Formulae C, D, E, and F can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

In addition to a host material as described above, green light-emitting layer 50g also includes a green light-emitting dopant. A singlet green light-emitting dopant can include a quinacridone compound, e.g. a compound of the following structure:

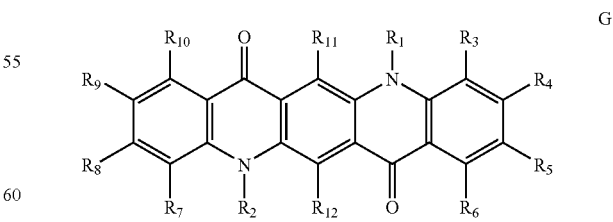

wherein substituent groups R$_1$ and R$_2$ are independently alkyl, alkoxyl, aryl, or heteroaryl; and substituent groups R$_3$ through R$_{12}$ are independently hydrogen, alkyl, alkoxyl, halogen, aryl, or heteroaryl, and adjacent substituent groups R$_3$ through R$_{10}$ can optionally be connected to form one or more ring systems, including fused aromatic and fused heteroaromatic rings, provided that the substituents are selected to provide an emission maximum between 510 nm and 540 nm. Alkyl, alkoxyl, aryl, heteroaryl, fused aromatic ring and fused heteroaromatic ring substituent groups can be further substituted. Some examples of useful quinacridones include those disclosed in U.S. Pat. No. 5,593,788 and in U.S. Patent Application Publication No. 2004/0001969A1.

Examples of useful quinacridone green dopants include:

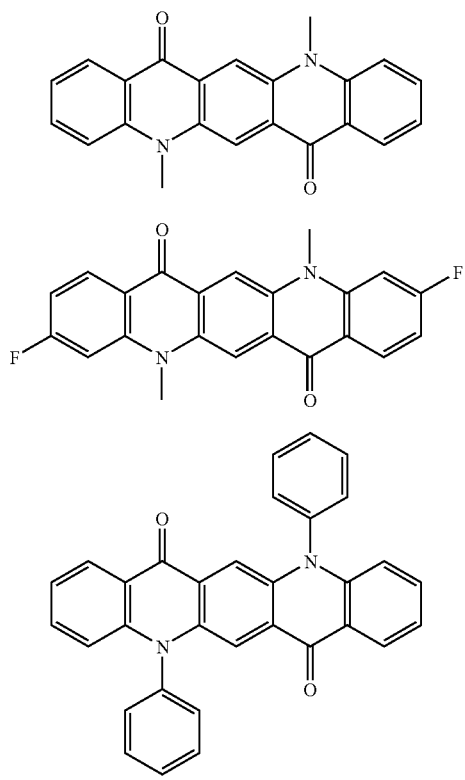

A singlet green light-emitting dopant can also include a 2,6-diaminoanthracene light-emitting dopant as represented by the formula below:

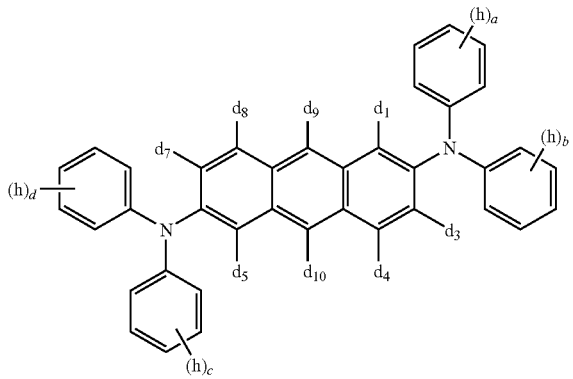

wherein $d_1$, $d_3$-$d_5$, and $d_7$-$d_{10}$ can be the same or different and each represents hydrogen or an independently selected substituent, and each h can be the same or different and each represents one or more independently selected substituents, provided that two substituents can combine to form a ring group and a-d are independently 0-5.

Green light-emitting layer 50g can optionally include a small amount of a blue light-emitting compound as a stabilizer. The presence of a blue light-emitting compound, which is a higher-energy dopant, provides greater luminance stability to the green emission of 2,6-diaminoanthracene dopants, while maintaining good efficiency of the green light-emitting dopants. Blue light-emitting compounds can be those described below for blue light-emitting layer 50b.

A singlet red-light-emitting compound can optionally be used in is yellow light-emitting layer 50y and can include a diindenoperylene compound of the following structure J:

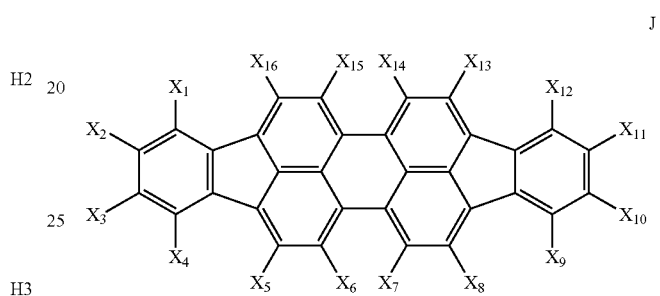

wherein:

$X_1$-$X_{16}$ are independently selected as hydrogen or substituents that include alkyl groups of from 1 to 24 carbon atoms; aryl or substituted aryl groups of from 5 to 20 carbon atoms; hydrocarbon groups containing 4 to 24 carbon atoms that complete one or more fused aromatic rings or ring systems; or halogen, provided that the substituents are selected to provide an emission maximum between 560 nm and 640 nm.

Illustrative examples of useful red dopants of this class are shown by Hatwar et al. in U.S. Pat. No. 7,247,394, the disclosure of which is incorporated by reference.

Other singlet red dopants useful in the present invention belong to the DCM class of dyes represented by Formula K:

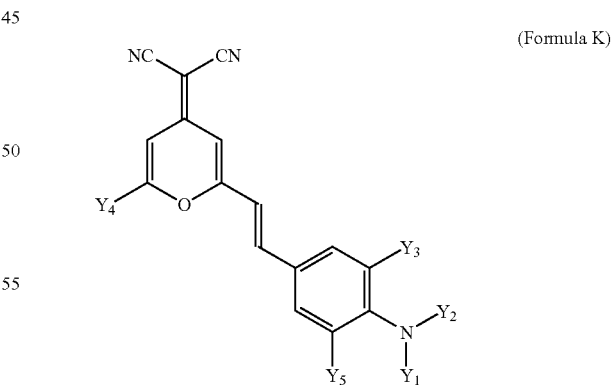

wherein $Y_1$-$Y_5$ represent one or more groups independently selected from: hydro, alkyl, substituted alkyl, aryl, or substituted aryl; $Y_1$-$Y_5$ independently include acyclic groups or can be joined pairwise to form one or more fused rings; provided that $Y_3$ and $Y_5$ do not together form a fused ring.

In a useful and convenient embodiment that provides red luminescence, $Y_1$-$Y_5$ of Formula K are selected independently from: hydro, alkyl, and aryl. Structures of particularly useful dopants of the DCM class are shown by Ricks et al. in U.S. Pat. No. 7,252,893, the disclosure of which is incorporated by reference.

A singlet light-emitting yellow compound such as used in yellow light-emitting layer 50y can include a compound of the following structures:

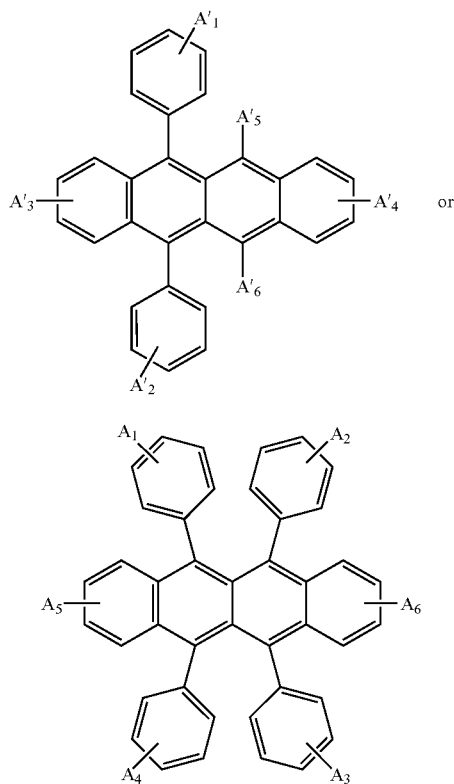

wherein $A_1$-$A_6$ and $A'_1$-$A'_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow dopants are shown by Ricks et al.

Another class of useful singlet yellow dopants are described in U.S. Pat. No. 6,818,327 and are according to formula L3:

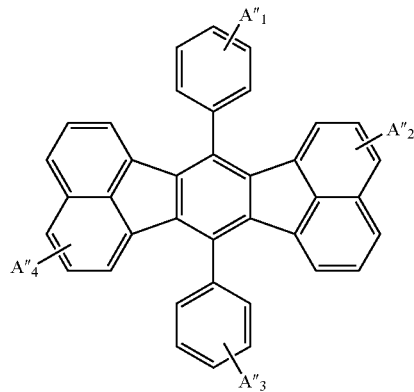

wherein $A''_1$-$A''_4$ represent one or more substituents on each ring and where each substituent is individually selected from one of the following:

Category 1: hydrogen, or allyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Particularly useful examples are where $A''_1$ and $A''_3$ are hydrogen and $A''_2$ and $A''_4$ are chosen from category 5.

A blue-light-emitting dopant that can be used in blue light-emitting layer 50b can include a bis(azinyl)azene boron complex compound of the structure M:

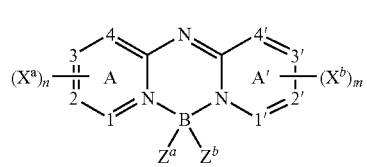

wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

Some examples of the above class of dopants are disclosed by Ricks et al in U.S. Pat. No. 7,252,893.

Another class of singlet blue dopants is the perylene class. Particularly useful blue dopants of the perylene class include perylene and tetra-t-butylperylene (TBP).

Another particularly useful class of singlet blue dopants in this invention includes blue-emitting derivatives of such styrylarenes and distyrylarenes as distyrylbenzene, styrylbiphenyl, and distyrylbiphenyl, including compounds described in U.S. Pat. No. 5,121,029, and U.S. Patent Application Publication No. 2006/0093856 by Helber et al. Among such derivatives that provide blue luminescence, particularly useful are those substituted with diarylamino groups. Examples include bis[2-[4-[N,N-diarylamino]phenyl]vinyl]-benzenes of the general structure N1 shown below:

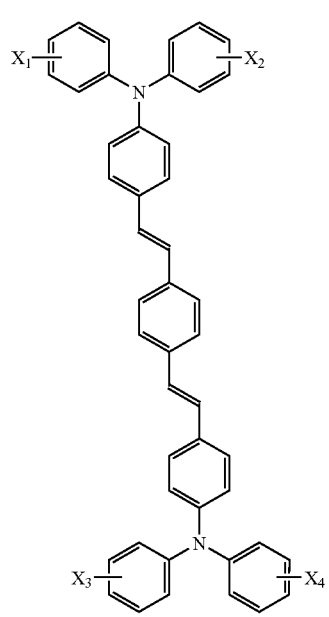

[N,N-diarylamino][2-[4-[N,N-diarylamino]phenyl]vinyl]biphenyls of the general structure N2 shown below:

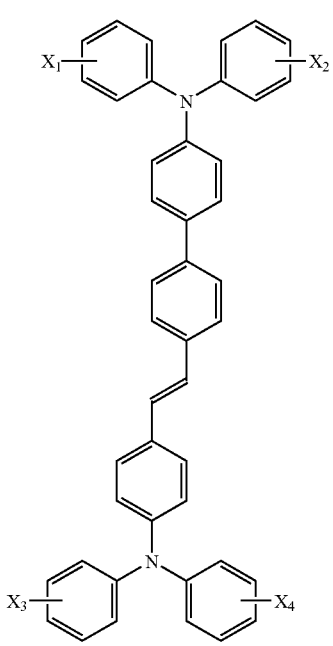

and bis[2-[4-[N,N-diarylamino]phenyl]vinyl]biphenyls of the general structure N3 shown below:

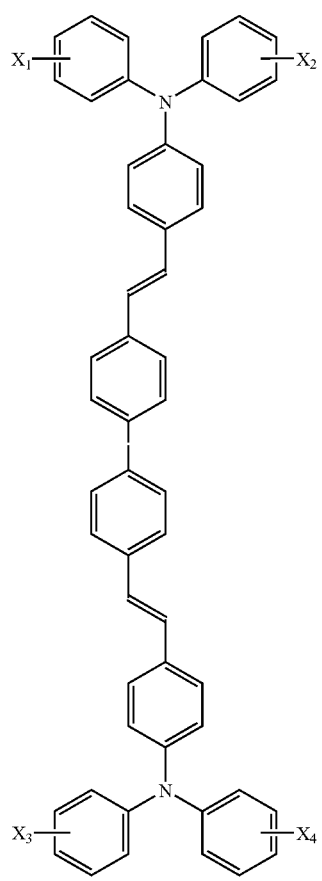

In Formulas N1 to N3, $X_1$-$X_4$ can be the same or different, and individually represent one or more substituents such as alkyl, aryl, fused aryl, halo, or cyano. In a preferred embodiment, $X_1$-$X_4$ are individually alkyl groups, each containing from one to about ten carbon atoms. A particularly preferred blue dopant of this class is disclosed by Ricks et al in U.S. Pat. No. 7,252,893.

In addition to singlet light-emitting dopants, triplet light-emitting dopants can also be useful in the present invention, particularly in green light-emitting layer 50g and yellow light-emitting layer 50y. Triplet light-emitting dopants useful in this invention have been described by Deaton et al. in U.S. Patent Application Publication No. 2008/0286610 and U.S. Patent Application Publication No. 2008/0284318, the disclosures of which are herein incorporated by reference.

Other OLED device layers that can be used in this invention have been well described in the art, and OLED devices 10 and 15, and other such devices described herein, can include layers commonly used for such devices. OLED devices are commonly formed on a substrate, e.g. OLED substrate 20. Such substrates have been well-described in the art. A bottom electrode is formed over OLED substrate 20 and is most commonly configured as an anode 30, although the practice of this invention is not limited to this configuration. When EL emission is viewed through the anode, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, are used as the anode. For applications where EL emission is viewed only through the cathode electrode, the transmissive characteristics of the anode are immaterial and any conductive material can be used, regardless if it is transparent, opaque, or reflective. Example conductors for the present invention include, but are not limited to, gold, iridium, molybdenum, palladium, and platinum. Typical anode materials, transmissive or otherwise, have a work function no less than 4.0 eV. Desired anode materials can be deposited by any suitable process such as evaporation, sputtering, chemical vapor deposition, or electrochemical deposition. Anode materials can be patterned using well-known photolithographic processes.

Hole-transporting layer 40 can be formed and disposed over the anode. Other hole-transporting layers, e.g. 45, can be used with other light-emitting units, as described above. Desired hole-transporting materials can be deposited by any suitable process such as evaporation, sputtering, chemical vapor deposition, electrochemical deposition, thermal transfer, or laser thermal transfer from a donor material. Hole-transporting materials useful in hole-transporting layers include hole-transporting compounds described above as light-emitting hosts.

Electron-transporting layers, e.g. 85, can contain one or more metal chelated oxinoid compounds, including chelates of oxine itself, also commonly referred to as 8-quinolinol or 8-hydroxyquinoline. Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials. It is useful for this invention that the electron-transporting layer be a lithium-doped layer.

An upper electrode most commonly configured as a cathode 90 is formed over the electron-transporting layer. If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. If the device is bottom-emitting, that is, where EL emission is viewed only through the anode electrode, the transmissive characteristics of the cathode are immaterial and any conductive material can be used. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

In OLED devices such as those described herein, one of the spaced electrodes is necessarily transmissive to visible light. The other electrode can be reflective. For example, in FIG. 2, the anodes are transmissive, while the cathode can be reflective. In such a structure, light-emitting unit 82 is disposed closer to the reflective electrode than light-emitting unit 75. As described by Boroson et al. in U.S. Patent Application Publication No. 2007/0001588, it can be particularly useful to place a red-to-green light-emitting unit (e.g. light-emitting unit 82) in the range of 60-90 nm from a reflecting electrode, and a blue light-emitting unit (e.g. light-emitting unit 75) in the range of 150-200 nm from the reflecting electrode.

OLED devices 10 and 15 can include other layers as well. For example, a hole-injecting layer 35 can be formed over the anode, as described in U.S. Pat. No. 4,720,432, U.S. Pat. No. 6,208,075, EP 0 891 121 A1, and EP 1 029 909 A1. An electron-injecting layer, such as alkaline or alkaline earth metals, alkali halide salts, or alkaline or alkaline earth metal doped organic layers, can also be present between the cathode and the electron-transporting layer.

The invention and its advantages can be better appreciated by the following comparative examples. In the first set, Examples 3 and 4 are representative examples of this invention, while Examples 1 and 2 are non-inventive tandem OLED examples for comparison purposes. The layers described as vacuum-deposited were deposited by evaporation from heated boats under a vacuum of approximately $10^{-6}$ Torr. After deposition of the OLED layers each device was then transferred to a dry box for encapsulation. The OLED has an emission area of 10 mm². The devices were tested by applying a current of 20 mA/cm² across electrodes. The results from Examples 1 to 4 are given in Table 1.

EXAMPLE 1

Comparative

1. A clean glass substrate was deposited by sputtering with indium tin oxide (ITO) to form a transparent electrode of 60 nm thickness.
2. The above-prepared ITO surface was treated with a plasma oxygen etch.
3. The above-prepared substrate was further treated by vacuum-depositing a 10 nm layer of hexacyanohexaazatriphenylene (CHATP) as a hole-injecting layer (HIL).

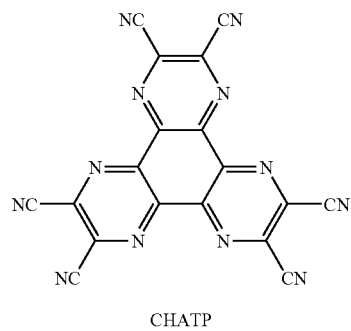

CHATP

4. The above-prepared substrate was further treated by vacuum-depositing a 150 nm layer of 4,4'-bis[N-(1-naphthyl)-N-phenylamino]biphenyl (NPB) as a hole-transporting layer (HTL).
5. The above-prepared substrate was further treated by vacuum-depositing a 30 nm blue light-emitting layer including 95% 9-(1-naphthyl)-10-(2-naphthyl)anthracene (NNA) host with 5% BED-1 as blue-emitting dopant.

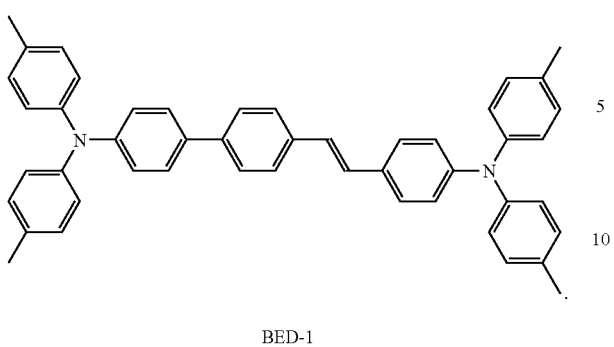

BED-1

6. A 40 nm mixed lithium-doped n-type layer was vacuum-deposited, including 49% 4,7-diphenyl-1,10-phenanthroline (also known as bathophen or Bphen), 49% lithium quinolinate (LiQ) as co-host, with 2% Li metal.
7. The above-prepared substrate was further treated by vacuum-depositing a 10 nm layer of CHATP as a p-type layer.
8. The above-prepared substrate was further treated by vacuum-depositing a 11 nm layer of NPB as an HTL.
9. The above-prepared substrate was further treated by vacuum-depositing a 20 nm yellow light-emitting layer including 97% NPB as host with 3% yellow-orange emitting dopant diphenyltetra-t-butylrubrene (PTBR).

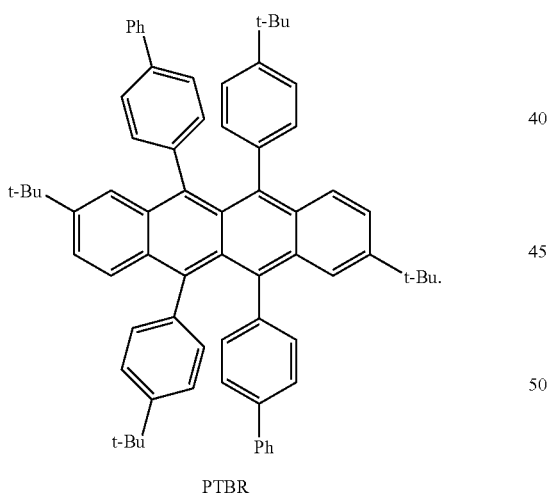

PTBR

10. The above-prepared substrate was further treated by vacuum-depositing a 40 nm green light-emitting layer including 95% 2-phenyl-9,10-bis(2-naphthyl)anthracene (PBNA) as host with 5% 2,6-bis(diphenylamino)-9,10-diphenylanthracene as green emitting dopant.
11. A 34 nm mixed lithium-doped electron-transporting layer was vacuum-deposited, including 49% Bphen and 49% LiQ as co-hosts, with 2% Li metal.
12. A 100 nm layer of aluminum was evaporatively deposited onto the substrate to form a cathode layer.

EXAMPLE 2

Comparative

An OLED device was constructed as described above for Example 1 except that Step 10a was added after Step 10 and Step 11 was modified as follows to keep the same overall device thickness:

10a. The above-prepared substrate was further treated by vacuum-depositing a 10 nm layer of 3,7,10-triphenyl-8-(4-biphenyl)fluoranthene (ETM-2, as described above) to form a fluoranthene-containing electron-transporting layer.
11. A 24 nm mixed lithium-doped electron-transporting layer was vacuum-deposited, including 49% Bphen and 49% LiQ as co-hosts, with 2% Li metal.

EXAMPLE 3

Inventive

An OLED device was constructed as described above for Example 1 except that Step 5a was added after Step 5 and Step 6 was modified as follows to keep the same overall device thickness:

5a. The above-prepared substrate was further treated by vacuum-depositing a 10 nm layer of ETM-2 to form a fluoranthene-containing electron-transporting layer.
6. A 30 nm mixed lithium-doped n-type layer was vacuum-deposited, including 49% Bphen, 49% LiQ as co-host, with 2% Li metal.

EXAMPLE 4

Inventive

An OLED device was constructed as described above for Example 1 except that Step 5a was added after Step 5, Step 10a was added after Step 10, and Steps 6 and 11 were modified as follows to keep the same overall device thickness:

5a. The above-prepared substrate was further treated by vacuum-depositing a 10 nm layer of ETM-2 to form a fluoranthene-containing electron-transporting layer.
6. A 30 nm mixed lithium-doped n-type layer was vacuum-deposited, including 49% Bphen, 49% LiQ as co-host, with 2% Li metal.
10a. The above-prepared substrate was further treated by vacuum-depositing a 10 nm layer of ETM-2 to form a fluoranthene-containing electron-transporting layer.
11. A 24 nm mixed lithium-doped electron-transporting layer was vacuum-deposited, including 49% Bphen and 49% LiQ as co-hosts, with 2% Li metal.

The results of these examples are shown in Table 1, below.

TABLE 1

Device data measured at 20 mA/cm$^2$ except stability

| Device # | Voltage | Lum Efficiency (cd/A) | CIEx | CIEy | QE % | T$_{50}$ at 80 ma/cm$^2$ | T$_{50}$ at 1000 cd/m$^2$ |
|---|---|---|---|---|---|---|---|
| Example 1 (Comparative) | 7.2 | 29.8 | 0.29 | 0.31 | 13.6 | 190 hr | 26,000 hr |
| Example 2 (Comparative) | 7.5 | 31.6 | 0.30 | 0.32 | 14.2 | 190 hr | 30,000 hr |
| Example 3 (Inventive) | 7.2 | 30.8 | 0.28 | 0.29 | 14.8 | 140 hr | 28,000 hr |
| Example 4 (Inventive) | 7.5 | 32.6 | 0.28 | 0.30 | 15.4 | 140 hr | 36,000 hr |

Table 1 shows that improved efficiency can be obtained with a display according to this invention. The inventive examples show improved quantum efficiency and luminance efficiency, with good color and good voltage requirements, in comparison to Example 1. Example 2, which is a comparative example according to Begley as referenced above, shows improvements relative to Example 1. However, Example 4, which has two additional electron-transporting layers in contact with the intermediate connector and the upper electron-transporting layer, respectively, shows the greatest improvement. This is also seen in the stability result. While the high-current lifetime (T$_{50}$ at 80 ma/cm$^2$) is shortened for the inventive examples, the lifetime at a constant light emission (T$_{50}$ at 1000 cd/m$^2$) is increased due to the increased efficiency, and therefore lower power requirements, of this device.

Examples 5 to 7 are some additional examples of this type of structure. The results for Examples 5 to 7 are given in Table 2.

EXAMPLE 5

Inventive

An OLED device was constructed as described above for Example 4.

EXAMPLE 6

Inventive

An OLED device was constructed as described above for Example 4 except that Step 5a was modified as follows:
5a. The above-prepared substrate was further treated by vacuum-depositing a 10 nm layer of 7,10-diphenyl-8-(4-biphenyl)fluoranthene (ETM-1, as described above) to form a fluoranthene-containing electron-transporting layer.

EXAMPLE 7

Inventive

An OLED device was constructed as described above for Example 4 except that Steps 5a and 10a were modified as follows:
5a. The above-prepared substrate was further treated by vacuum-depositing a 10 nm layer of ETM-1 to form a fluoranthene-containing electron-transporting layer.

10a. The above-prepared substrate was further treated by vacuum-depositing a 10 nm layer of ETM-1 to form a fluoranthene-containing electron-transporting layer.

The results of these examples are shown in Table 2, below.

TABLE 2

Device data measured at 20 mA/cm$^2$

| Device # | Voltage | Lum Efficiency (cd/A) | CIEx | CIEy | QE % |
|---|---|---|---|---|---|
| Example 5 (Inventive) | 7.5 | 32.7 | 0.29 | 0.32 | 14.4 |
| Example 6 (Inventive) | 7.3 | 34.4 | 0.28 | 0.31 | 15.6 |
| Example 7 (Inventive) | 7.0 | 33.0 | 0.28 | 0.30 | 15.5 |

Table 2 shows that other fluoranthenes can be used to good effect in this invention. The inventive examples show improved quantum efficiency and luminance efficiency, with good color and good voltage requirements.

Examples 8 to 14 compare other electron-transporting materials to the fluoranthenes of this invention. The results for Examples 8 to 14 are given in Table 3.

EXAMPLE 8

Inventive

An OLED device was constructed as described above for Example 4.

EXAMPLES 9 TO 14

Comparative

An OLED device was constructed as described above for Example 4 except that Step 5a included a 10 nm layer of the following materials:

| | |
|---|---|
| Example 8 (Inventive) | ETM-2 |
| Example 9 (Comparative) | tris(8-quinolinolato)aluminum (III) (ALQ) |
| Example 10 (Comparative) | Rubrene |
| Example 11 (Comparative) | NNA |
| Example 12 (Comparative) | PBNA |

-continued

| | |
|---|---|
| Example 13 (Comparative) | BPhen |
| Example 14 (Comparative) | Comparative fluoranthene 1 (CF-1) |

CF-1

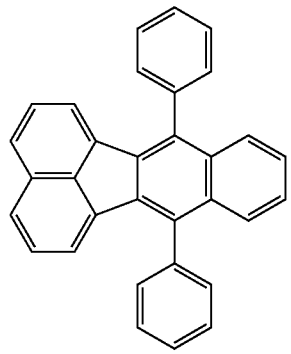

The results of these examples are shown in Table 3, below.

TABLE 3

Device data measured at 20 mA/cm² except CIEx, CIEy change with current measured from 0.01 mA/cm² 100 mA/cm²

| Device # | Voltage | Lum Effi-ciency (cd/A) | CIEx | CIEy | QE % | CIEx change with current | CIEy change with current |
|---|---|---|---|---|---|---|---|
| Example 8 (Inventive) | 7.5 | 35.0 | 0.286 | 0.327 | 15.1 | 0.012 | 0.033 |
| Example 9 (Comparative) | 8.4 | 31.5 | 0.315 | 0.356 | 12.8 | 0.134 | 0.183 |
| Example 10 (Comparative) | 8.4 | 30.0 | 0.329 | 0.369 | 11.9 | 0.098 | 0.138 |
| Example 11 (Comparative) | 7.7 | 33.7 | 0.292 | 0.321 | 14.7 | 0.046 | 0.080 |
| Example 12 (Comparative) | 7.5 | 33.7 | 0.288 | 0.320 | 14.8 | 0.031 | 0.053 |
| Example 13 (Comparative) | 7.7 | 32.0 | 0.290 | 0.307 | 14.7 | 0.049 | 0.063 |
| Example 14 (Comparative) | 8.4 | 31.8 | 0.303 | 0.332 | 13.6 | 0.011 | 0.038 |

Table 3 shows other materials frequently used as electron-transporting materials are not effective in the second electron-transporting layer. Several (Examples 9, 10, and 14) show increased voltage requirements. Most show color shifts between emissions with low and high currents that range from undesirable (Examples 12 and 13) to unacceptable (Examples 9 through 11). Only inventive Example 8 shows good results across all measurements. Example 14 is of a non-inventive fluoranthene, where an additional aromatic ring is annulated to the fluoranthene nucleus.

For the next set of examples, Example 15 is an inventive example. Examples 16 to 18 show the deleterious effect of replacing one or both of the second electron-transporting layers with a different material. Examples 19 and 20 show the deleterious effect of removing lithium doping from the electron-transporting layer or the n-type layer. The results for Examples 15 to 20 are given in Table 4.

EXAMPLE 15

Inventive

An OLED device was constructed as described above for Example 4.

EXAMPLE 16

Comparative

An OLED device was constructed as described above for Example 4 except that Step 10a included a 10 nm layer of NNA.

EXAMPLE 17

Comparative

An OLED device was constructed as described above for Example 4 except that Step 5a included a 10 nm layer of NNA.

EXAMPLE 18

Comparative

An OLED device was constructed as described above for Example 4 except that Steps 5a and 10a each included a 10 nm layer of NNA.

EXAMPLE 19

Comparative

An OLED device was constructed as described above for Example 4 except that Step 11 was modified as follows:
  11. A 24 nm mixed electron-transporting layer was vacuum-deposited, including 50% Bphen and 50% LiQ.

EXAMPLE 20

Comparative

An OLED device was constructed as described above for Example 4 except that Step 6 was modified as follows:
  6. A 30 nm mixed n-type layer was vacuum-deposited, including 50% Bphen and 50% LiQ.

The results of these examples are shown in Table 4, below.

TABLE 4

Device data measured at 20 mA/cm²

| Device # | Voltage | Lum Efficiency (cd/A) | CIEx | CIEy | QE % |
|---|---|---|---|---|---|
| Example 15 (Inventive) | 7.8 | 34.5 | 0.28 | 0.30 | 16.0 |
| Example 16 (Comparative) | 8.4 | 34.5 | 0.27 | 0.31 | 15.6 |
| Example 17 (Comparative) | 8.2 | 34.4 | 0.29 | 0.32 | 15.0 |
| Example 18 (Comparative) | 8.5 | 33.5 | 0.28 | 0.32 | 14.7 |
| Example 19 (Comparative) | 11.7 | 29.3 | 0.24 | 0.29 | 13.7 |
| Example 20 (Comparative) | 21.7 | 28.9 | 0.36 | 0.40 | 10.9 |

In Table 4, Examples 16 to 18 show that the use of another material, instead of a fluoranthene as described herein, shows an undesirable increase in the required voltage to drive the device. Examples 19 and 20 show that removal of the lithium doping in the electron-transporting layer or in the n-type layer of the connector results in a large and unacceptable increase in the required driving voltage.

Examples 21 to 23 are some additional examples of this type of structure wherein the fluoranthene is mixed with another electron-transporting layer material (lithium quinolate). The results for Examples 21 to 23 are given in Table 5.

EXAMPLE 21

Inventive

An OLED device was constructed as described above for Example 7.

EXAMPLE 22

Inventive

An OLED device was constructed as described above for Example 21 except that Step 5a was modified as follows:
5a. The above-prepared substrate was further treated by vacuum-depositing a 10 nm layer of 50% ETM-1 and 50% LiQ to form a fluoranthene-containing electron-transporting layer.

EXAMPLE 23

Inventive

An OLED device was constructed as described above for Example 21 except that Step 5a was modified as follows:
5a. The above-prepared substrate was further treated by vacuum-depositing a 10 nm layer of 25% ETM-1 and 75% LiQ to form a fluoranthene-containing electron-transporting layer.

The results of these examples are shown in Table 5, below.

TABLE 5

Device data measured at 20 mA/cm² except stability

| Device # | Voltage | Lum Efficiency (cd/A) | CIEx | CIEy | QE % | $T_{50}$ at 80 ma/cm² | $T_{50}$ at 1000 cd/m² |
|---|---|---|---|---|---|---|---|
| Example 21 (Inventive) | 7.2 | 29.8 | 0.28 | 0.31 | 14.2 | 120 hr | 9,000 hr |
| Example 22 (Inventive) | 7.5 | 30.2 | 0.28 | 0.30 | 14.7 | 170 hr | 31,000 hr |
| Example 23 (Inventive) | 8.0 | 28.7 | 0.28 | 0.30 | 13.4 | 240 hr | 50,000 hr |

In Table 5, Example 22 shows that mixing the fluoranthene layer with 50% lithium quinolate improves the stability and maintains high efficiency. Increasing the percentage of lithium quinolate even further, to 75% in Example 23, shows a further increase in stability, but also shows a trade-off in lower efficiency and an increase in voltage requirements.

The invention has been described in detail with particular reference to certain preferred embodiments thereof, but it will be understood that variations and modifications can be effected within the spirit and scope of the invention.

| PARTS LIST | |
|---|---|
| 10 | OLED device |
| 15 | OLED device |

-continued

| PARTS LIST | |
|---|---|
| 20 | substrate |
| 30 | anode |
| 35 | hole-injecting layer |
| 40 | hole-transporting layer |
| 45 | hole-transporting layer |
| 50b | blue light-emitting layer |
| 50y | yellow light-emitting layer |
| 50g | green light-emitting layer |
| 55 | intermediate connector |
| 60 | fluoranthene-containing electron-transporting layer |
| 65 | n-type layer |
| 70 | fluoranthene-containing electron-transporting layer |
| 75 | light-emitting unit |
| 80 | light-emitting unit |
| 82 | light-emitting unit |
| 85 | electron-transporting layer |
| 90 | cathode |
| 95 | p-type layer |

The invention claimed is:

1. A white-light-emitting tandem OLED device having spaced anode and cathode comprising:
  a. first and second light-emitting units disposed between the cathode and anode;
  b. an intermediate connector comprising an n-type layer and a p-type layer disposed between the first and second light-emitting units; and
  c. a fluoranthene-containing electron-transporting layer adjacent to the n-type layer of the intermediate connector and comprising at least 25% of a 7,10-diaryl-substituted fluoranthene compound having no aromatic rings annulated to the fluoranthene nucleus.

2. The tandem OLED device of claim 1 wherein the n-type layer is a lithium-doped layer.

3. The tandem OLED device of claim 1 further including a second electron-transporting layer adjacent to the cathode and a second fluoranthene-containing electron-transporting layer adjacent to the second electron-transporting layer.

4. The tandem OLED device of claim 3 wherein the n-type layer, or the electron-transporting layer, or both are lithium-doped.

5. The tandem OLED of claim 1 wherein the fluoranthene compound is according to Formula (I):

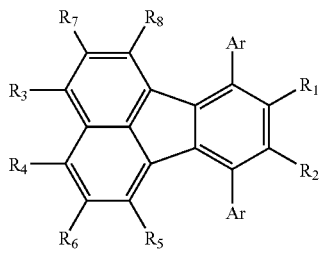

Formula (I)

wherein each Ar is an aromatic ring containing 6 to 24 carbon atoms bonded to the fluoranthene nucleus and they can be the same or different; and $R_1$-$R_8$ are individually selected from hydrogen and aromatic ring groups containing 6 to 24 carbon atoms with the proviso that no two adjacent $R_1$-$R_8$ substituents can join to form an aromatic ring system annulated to the fluoranthene nucleus.

6. The tandem OLED device of claim 5 wherein the fluoranthene compound is according to Formula (II):

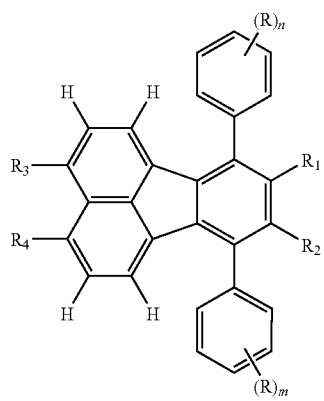

Formula II wherein:
$R_1$, $R_2$, $R_3$ and $R_4$ are independently hydrogen or an aromatic group containing 6 to 24 carbon atoms with the proviso that any adjacent $R_1$-$R_4$ is not joined to form part of an annulated aromatic ring system; R is hydrogen or a substituent; and n and m are independently 1-5.

7. The tandem OLED device of claim 6 wherein the fluoranthene compound is according to Formula (III-a) or (III-b):

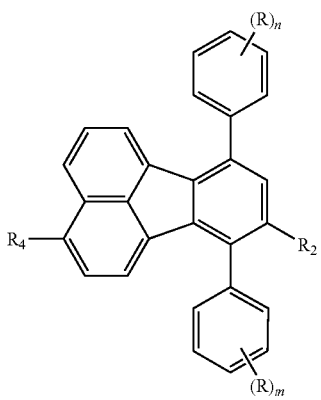

Formula (III-a)

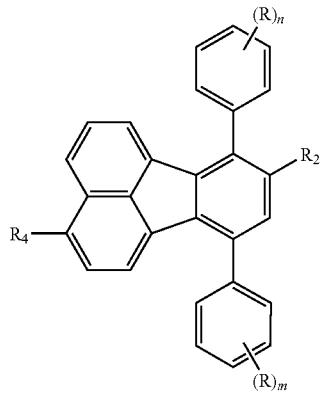

Formula (III-b)

wherein:
$R_2$ and $R_4$ are independently hydrogen or an aromatic group containing 6 to 24 carbon atoms with the proviso that $R_2$ and $R_4$ cannot both be hydrogen nor can $R_2$ be joined with R to form a ring; and R is hydrogen or an optional substituent; and n and m are independently 1-5.

8. The tandem OLED device of claim 1 wherein one of the light-emitting units emits light in the blue region of the visible spectrum and the other light-emitting unit emits light in the red to green region of the visible spectrum.

9. The tandem OLED device of claim 1 further including a second electron-transporting layer adjacent to the cathode.

10. The tandem OLED device of claim 1 wherein each of the light-emitting units comprises a hole transporting layer.

11. The tandem OLED device of claim 1 further comprising a hole injection layer adjacent to the anode.

12. The tandem OLED device of claim 6 wherein at least one of the light-emitting units include an anthracene derivative having hydrocarbon or substituted hydrocarbon substituents at the 9 and 10 positions.

13. The tandem OLED device of claim 6 wherein the anthracene derivative is according to Formula B:

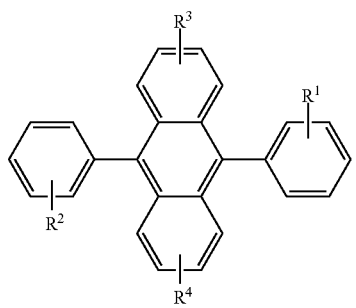

Formula B wherein $R^1$, $R^2$, $R^3$, and $R^4$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and
Group 6: fluorine, chlorine, bromine or cyano.
14. The tandem OLED device of claim 6 wherein the fluoranthene compound is according to any of Formulas ETM1-ETM21:
ETM1
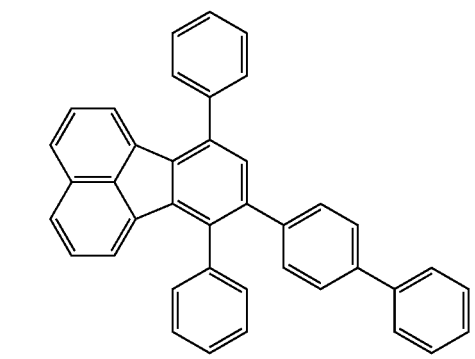
ETM2
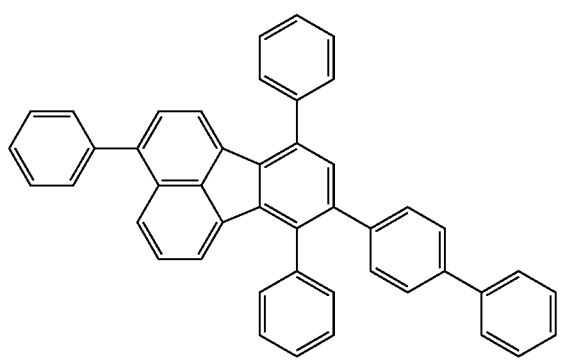
ETM3
ETM4
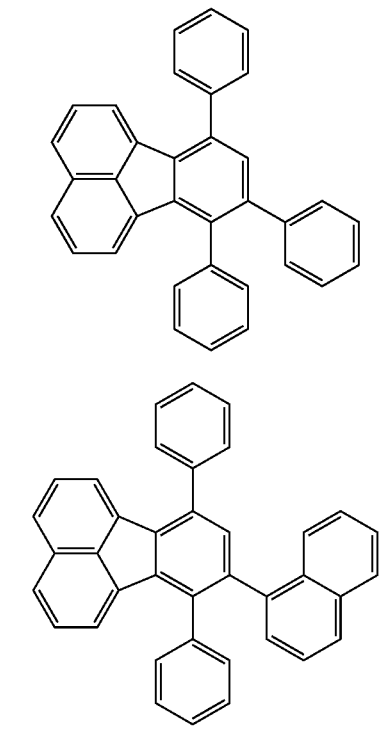
ETM5
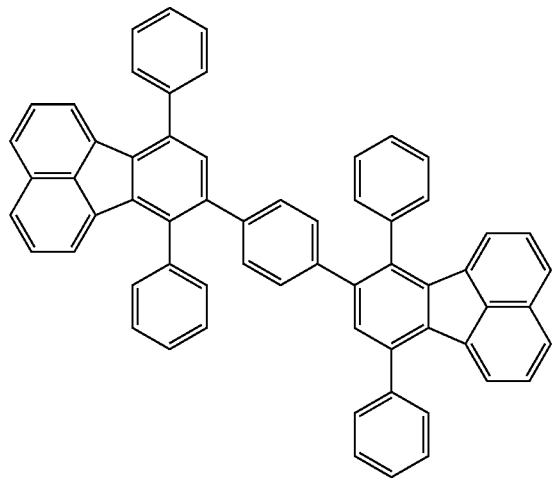
ETM6
ETM7
ETM8
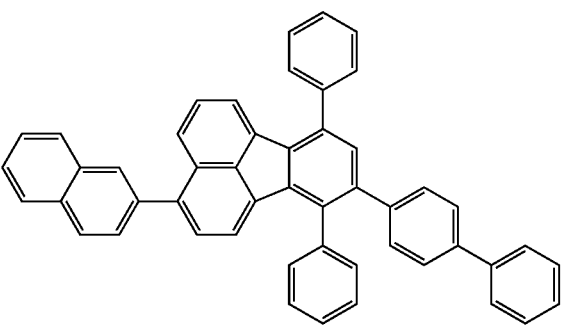

-continued
ETM9
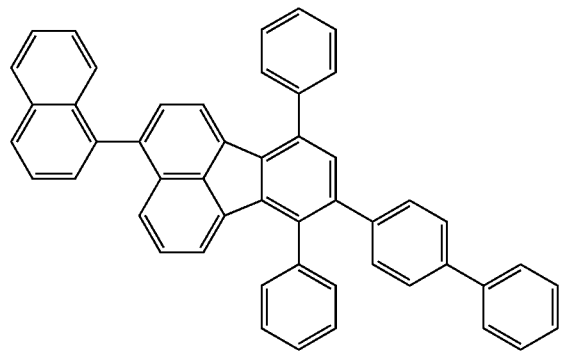
ETM10
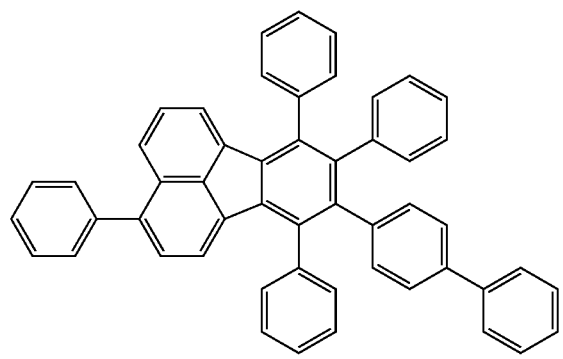
ETM11
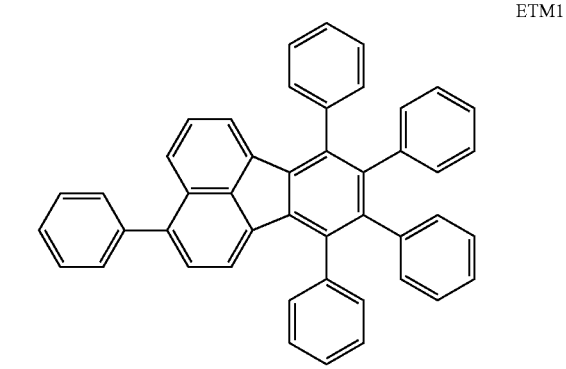
ETM12
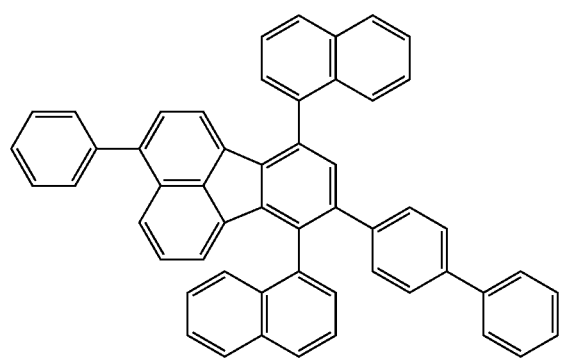
-continued
ETM13
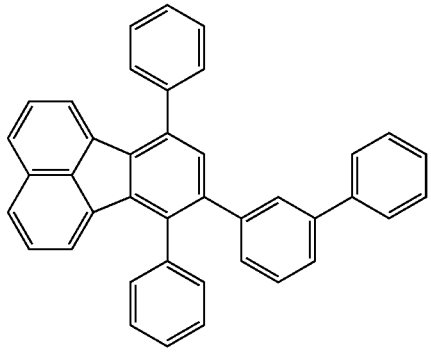
ETM14
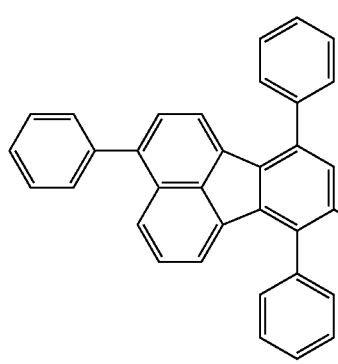
ETM15
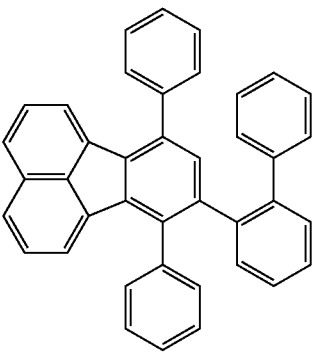
ETM16
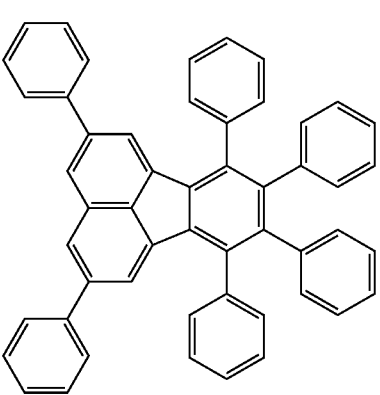

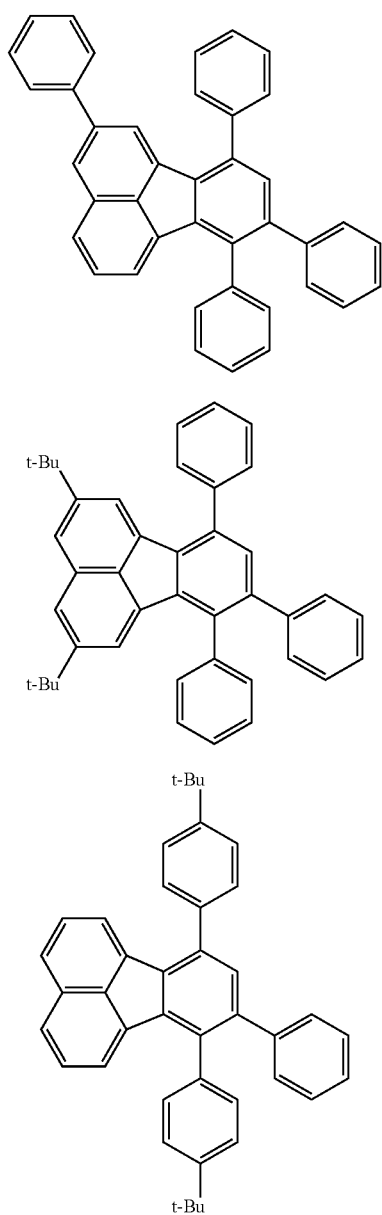
ETM17
ETM18
ETM19
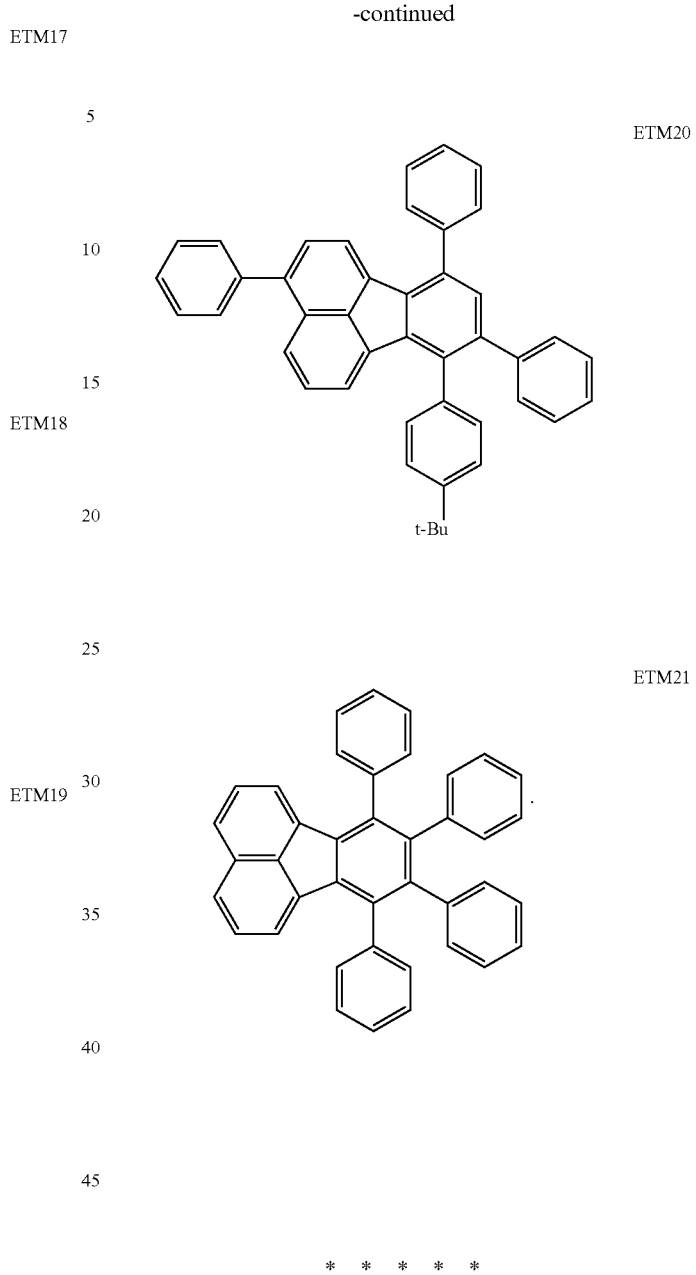
ETM20
ETM21
* * * * *